(12) United States Patent  
Lee et al.

(10) Patent No.: US 12,171,075 B2
(45) Date of Patent: Dec. 17, 2024

(54) DISPLAY DEVICE

(71) Applicant: LG Display Co., Ltd., Seoul (KR)

(72) Inventors: Hyosung Lee, Gwangmyeong-si (KR); SeungHee Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 159 days.

(21) Appl. No.: 17/977,305

(22) Filed: Oct. 31, 2022

(65) Prior Publication Data

US 2023/0217609 A1 Jul. 6, 2023

(30) Foreign Application Priority Data

Dec. 30, 2021 (KR) .................. 10-2021-0192892

(51) Int. Cl.
*G06F 1/16* (2006.01)
*H05K 5/02* (2006.01)

(52) U.S. Cl.
CPC .......... *H05K 5/0217* (2013.01); *G06F 1/1652* (2013.01)

(58) Field of Classification Search
CPC ............................ G06F 1/1652; H05K 5/0217
See application file for complete search history.

(56) References Cited

U.S. PATENT DOCUMENTS

| 8,035,577 | B2 | 10/2011 | Lafarre et al. |
| 10,045,448 | B2 | 8/2018 | Yang |
| 10,564,676 | B2 | 2/2020 | Kwon et al. |
| 10,671,124 | B2 | 6/2020 | Kim et al. |
| 10,701,821 | B2 | 6/2020 | Kim et al. |
| 10,877,525 | B2 | 12/2020 | Kang et al. |
| 11,140,794 | B2 | 10/2021 | Ran |
| 11,526,198 | B1 | 12/2022 | Kanas et al. |
| 11,553,610 | B2 | 1/2023 | Lee et al. |
| 11,785,726 | B2 | 10/2023 | Han et al. |
| 2007/0241002 | A1 | 10/2007 | Wu et al. |
| 2013/0021762 | A1 | 1/2013 | Van Dijk et al. |
| 2016/0324021 | A1 | 11/2016 | Takayanagi et al. |
| 2016/0363960 | A1* | 12/2016 | Park .................... G09F 15/0062 |
| 2017/0013735 | A1 | 1/2017 | Choi et al. |
| 2017/0103735 | A1 | 4/2017 | Oh et al. |
| 2017/0156219 | A1 | 6/2017 | Heo et al. |
| 2017/0344073 | A1 | 11/2017 | Kang et al. |

(Continued)

FOREIGN PATENT DOCUMENTS

| CN | 106340254 A | 1/2017 |
| CN | 106981254 A | 7/2017 |

(Continued)

*Primary Examiner* — Jacob R Crum
(74) *Attorney, Agent, or Firm* — Seed IP Law Group LLP

(57) ABSTRACT

A display device includes a display part including a display panel for displaying an image, a roller part configured to wind or unwind the display part, and a tape spring configured to move the display part in an upward and/or downward direction in conjunction with an operation of the roller part, and the roller part includes: a motor; a tape spring drum configured to accommodate the motor and connected to the motor, the tape spring drum being configured such that one end of the tape spring is fixed to the tape spring drum, and the tape spring drum winds or unwinds the tape spring; a tape spring casing configured to accommodate the tape spring drum and the tape spring; and a plurality of roll drums connected to two opposite sides of the motor.

20 Claims, 18 Drawing Sheets

(56) References Cited

U.S. PATENT DOCUMENTS

| | | |
|---|---|---|
| 2017/0359911 A1 | 12/2017 | Hayk et al. |
| 2018/0110137 A1 | 4/2018 | Kim et al. |
| 2018/0114471 A1* | 4/2018 | Park .................. G06F 1/1652 |
| 2018/0125228 A1* | 5/2018 | Porter ................ H05K 5/0017 |
| 2019/0246512 A1 | 8/2019 | Heo et al. |
| 2019/0324502 A1 | 10/2019 | Chang et al. |
| 2020/0100371 A1 | 3/2020 | Choi |
| 2021/0337684 A1 | 10/2021 | Pyo et al. |
| 2021/0375165 A1 | 12/2021 | Feng |
| 2021/0397219 A1* | 12/2021 | Ku ..................... G06F 1/1652 |
| 2023/0004189 A1 | 1/2023 | Luo et al. |
| 2023/0345655 A1 | 10/2023 | Sano et al. |

FOREIGN PATENT DOCUMENTS

| | | |
|---|---|---|
| CN | 107452282 A | 12/2017 |
| CN | 109859635 A | 6/2019 |
| CN | 109996019 A | 7/2019 |
| CN | 110010002 A | 7/2019 |
| CN | 107408358 B | 6/2020 |
| CN | 111510538 A | 8/2020 |
| CN | 212782502 U | 3/2021 |
| CN | 112712759 A | 4/2021 |
| CN | 112874120 A | 6/2021 |
| CN | 113077719 A | 7/2021 |
| CN | 113433786 A | 9/2021 |
| EP | 3 115 988 A1 | 1/2017 |
| EP | 3300059 A1 | 3/2018 |
| GB | 2508194 A | 5/2014 |
| JP | H04166370 A | 6/1992 |
| JP | 2006299897 A | 11/2006 |
| JP | 2008530611 A | 8/2008 |
| JP | 2017536573 A | 12/2017 |
| JP | 2019028461 A | 2/2019 |
| JP | 2021525400 A | 9/2021 |
| KR | 10-2015-0005890 A | 1/2015 |
| KR | 20160059372 A | 5/2016 |
| KR | 20170006013 A | 1/2017 |
| KR | 10-2017-0136060 A | 12/2017 |
| KR | 20170136951 A | 12/2017 |
| KR | 10-2018-0045980 A | 5/2018 |
| KR | 20210126851 A | 10/2021 |
| WO | 2020/256183 A1 | 12/2020 |
| WO | 2021/058899 A1 | 4/2021 |

* cited by examiner

DISPLAY DEVICE

CROSS-REFERENCE TO RELATED APPLICATIONS

This application claims the priority of Korean Patent Application No. 10-2021-0192892 filed on Dec. 30, 2021 in the Korean Intellectual Property Office, the entire contents of which are hereby incorporated herein by reference.

BACKGROUND

Technical Field

The present disclosure relates to a display device, and more particularly, to a rollable display device capable of displaying images in a rolled configuration of the display device.

Description of the Related Art

Display devices are known for use as a monitor of a computer, a TV set, a mobile phone, and the like, and include an organic light-emitting display (OLED) configured to autonomously emit light, and a liquid crystal display (LCD) with a separate light source.

The range of application of display devices is being diversified from the examples above to personal mobile devices, and studies are being conducted on display devices having wide display areas with reduced volumes and weights.

In addition, recently, rollable display devices have attracted attention as a next-generation display device.

BRIEF SUMMARY

In an embodiment, a rollable display device includes display parts, lines, and the like on a substrate made of a flexible plastic material having flexibility and thus may display images even in a case in which the rollable display device is rolled up.

In one or more embodiments of the present disclosure, a display device is provided to improve spatial utilization by minimizing a volume of a roller part.

In one or more embodiments of the present disclosure, a display device is provided that is capable of overcoming challenges associated with a position of a display changing when the display part is wound or unwound.

In one or more embodiments of the present disclosure, a display device is provided that is capable of minimizing a space utilized for winding and unwinding operations.

Embodiments of the present disclosure are not limited to the above-mentioned embodiments, and other embodiments which are not mentioned above can be clearly understood by those skilled in the art from the following description.

According to an embodiment of the present disclosure, a display device includes: a display including a display panel configured to display an image; a roller configured to wind or unwind the display; and a tape spring configured to move the display in an upward/downward direction in conjunction with an operation of the roller, the roller including: a motor; a tape spring drum configured to accommodate the motor and connected to the motor, the tape spring drum being configured such that one end of the tape spring is fixed to the tape spring drum, and the tape spring drum winds or unwinds the tape spring; a tape spring casing configured to accommodate the tape spring drum and the tape spring; and a plurality of roll drums connected to two opposite sides of the motor.

Other detailed matters of the example embodiments are included in the detailed description with reference to the accompanying drawings.

According to the present disclosure, the roller, which winds or unwinds the display, and the motor, which operates the roller, are disposed in the same space. Therefore, it is possible to minimize a space required to operate the display device.

According to the present disclosure, it is possible to reduce a slip of the winding/unwinding roller and a slip of the display part caused by a difference in rotational speed between the winding/unwinding roller and the display part of the display device.

The benefits and advantages according to the present disclosure are not limited to the contents above, and additional benefits and advantages are included in the following description.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
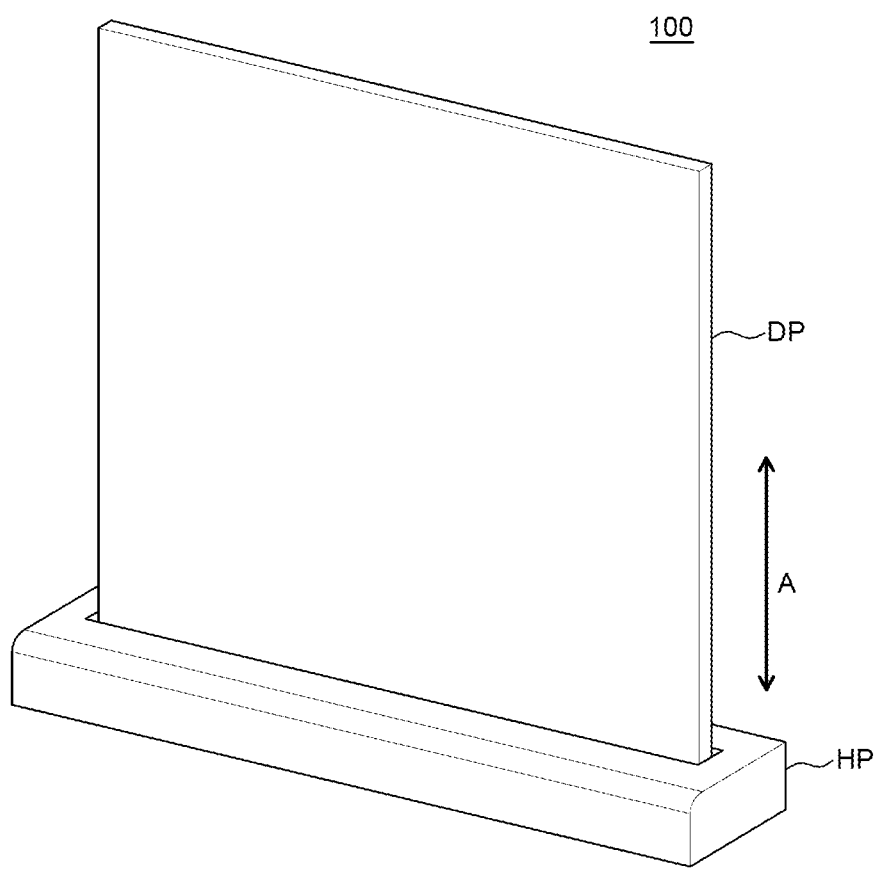
FIG. 1A is a perspective view of a display device with a display extending from a housing according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing may be illustrated for convenience of description, and the present disclosure is not necessarily limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to example embodiments of the present disclosure will be described in detail with reference to accompanying drawings.

Rollable Display Device

A rollable display device refers to a display device capable of displaying images even in a case in which the rollable display device is rolled up. The rollable display device may have higher flexibility than a general display device in the related art. A shape and configuration of the rollable display device may be freely changed depending on whether the rollable display device is in use, or not. Specifically, when the rollable display device is not in use, the rollable display device may be rolled up and stored with a reduced volume. On the contrary, when the rollable display device is in use, the rolled-up rollable display device may be unrolled again and used.

Figure 1B:
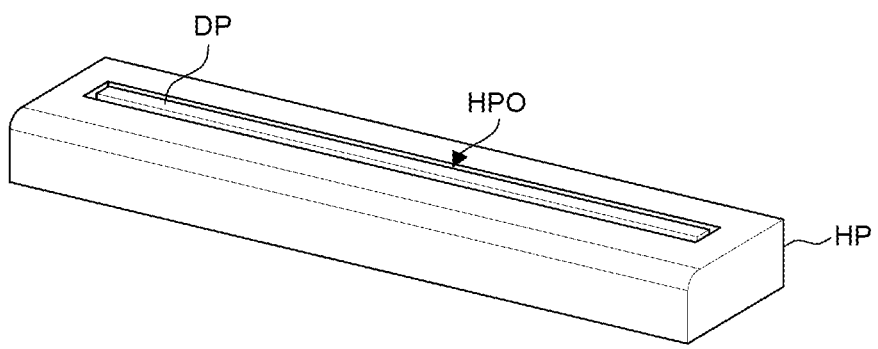
FIG. 1B is a perspective view of the display device of FIG. 1A with the display accommodated in the housing.

FIGS. 1A and 1B are perspective views of a display device 100 according to an embodiment of the present disclosure.

First, referring to FIGS. 1A and 1B, the display device 100 includes a display part DP (which may also be referred to herein as a display DP or a display assembly DP) and a housing part HP (which may also be referred to herein as a housing HP or a housing assembly HP).

The display part DP is configured to display images to a user. For example, display elements and circuits, lines, and components for operating the display elements may be disposed on the display part DP. In this case, because the display device 100 according to an embodiment of the present disclosure is a rollable display device 100, the display part DP may be configured to be wound or unwound. For example, the display part DP may include a display panel having flexibility so as to be wound or unwound, and a plurality of back bars. The display part DP will be described below in more detail with reference to FIGS. 2 to 4B.

The housing part HP is a casing capable of accommodating the display part DP. The display part DP may be wound and accommodated in the housing part HP, as best shown in FIG. 1B. The display part DP may be unwound and disposed outside the housing part HP, as best shown in FIG. 1A. Movement of the display part DP into and out of the housing part HP is generally represented by arrow A in FIG. 1A.

The housing part HP has an opening portion HPO through which the display part DP may move into and out of the housing part HP. The display part DP may move in an upward/downward direction while passing through the opening portion HPO of the housing part HP.

Meanwhile, the display part DP of the display device 100 may switch from a fully unwound state to a fully wound state or switch from the fully wound state to the fully unwound state. In an embodiment, the display part DP can also be arranged in a position between the fully unwound and fully wound states.

FIG. 1A illustrates the display part DP of the display device 100 in the fully unwound state. The fully unwound state is a state in which the display part DP of the display device 100 is disposed completely outside the housing part HP. That is, the fully unwound state may be defined as a state in which the display part DP is maximally unwound and disposed outside the housing part HP by a maximum amount in which the display part DP cannot be unwound any further in order to allow a user to see the image on the display device 100.

FIG. 1B illustrates the display part DP of the display device 100 in the fully wound state. The fully wound state is a state in which the display part DP of the display device 100 is accommodated in the housing part HP and cannot be wound any further. The configuration of the display part DP inside the housing part HP is advantageous in terms of an external appearance when the user does not see the image on the display device 100. Therefore, the fully wound state may be defined as a state in which the display part DP is wound and fully accommodated in the housing part HP. In addition, in the fully wound state, the volume of the display device 100 decreases, and the display device 100 may be more easily stored and transported.

Display Part

Figure 2:
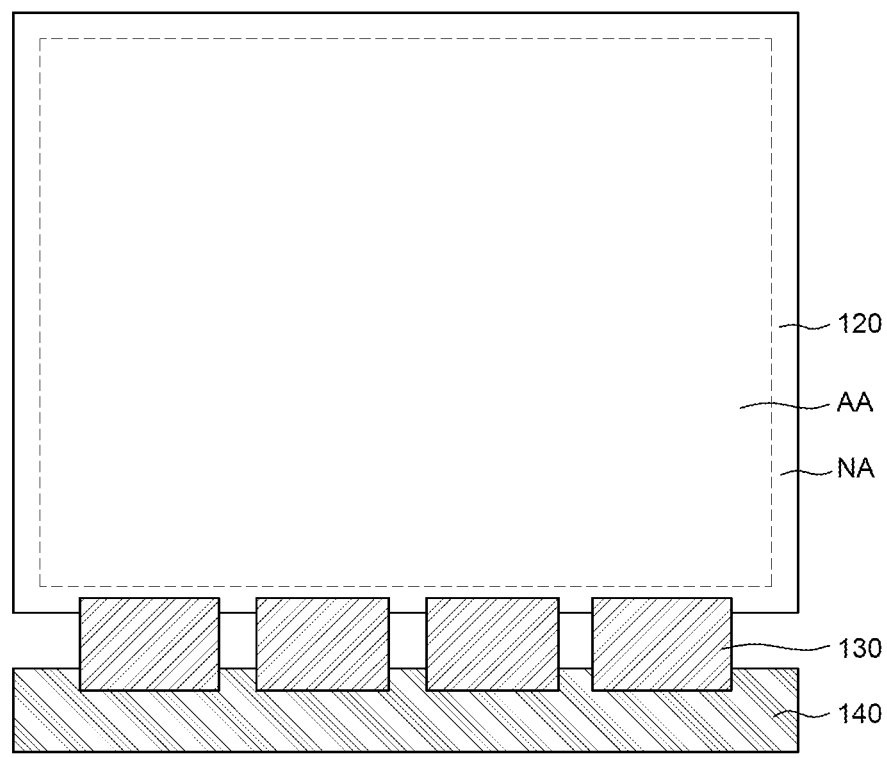
FIG. 2 is a front elevational view of the display of the display device of FIG. 1A.
Figure 3:
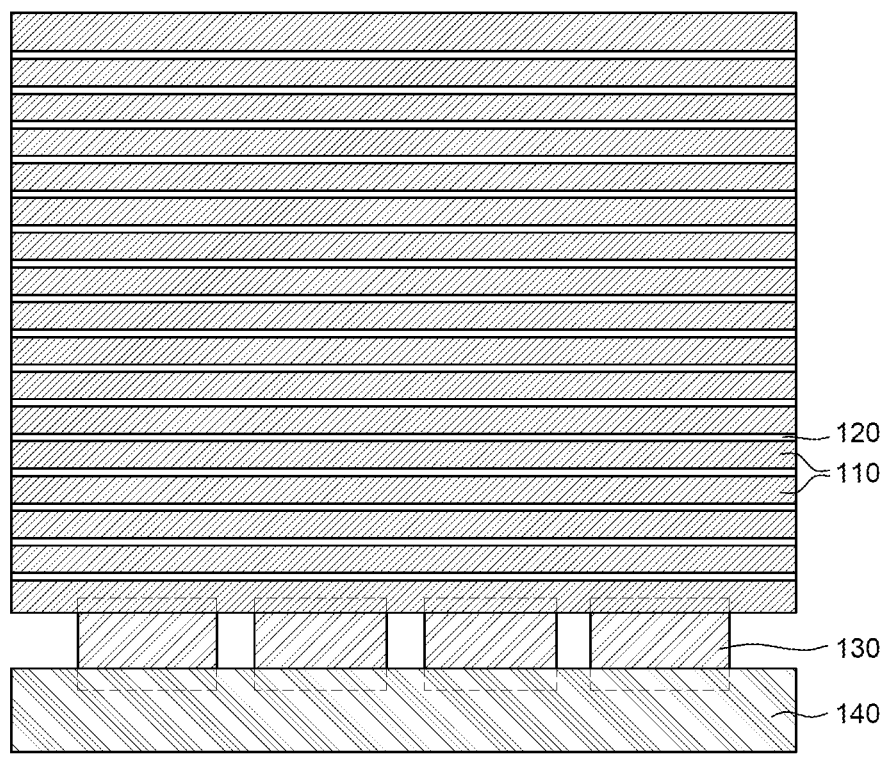
FIG. 3 is a rear elevational view of the display of the display device of FIG. 1A.
Figure 3:
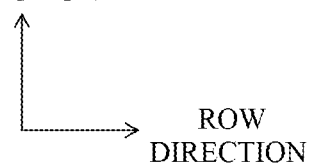

FIG. 2 is a front elevational view of the display part DP of the display device 100. FIG. 3 is a rear elevational view of the display part DP of the display device 100. Referring to FIGS. 2 and 3, the display part DP of the display device 100 includes a plurality of back bars 110, a display panel 120, a flexible film 130 (which may include one or more flexible films 130), and a printed circuit board 140.

The display panel 120 is a panel configured to display images to a user. The display panel 120 may include a display element configured to display images, a driving element configured to operate the display element, and lines configured to transmit various types of signals to the display element and the driving element.

The display panel 120 may include different display elements depending on the type of the display panel 120. For example, in a case in which the display panel 120 is an organic light-emitting display panel, the display element may be an organic light-emitting element including an anode, an organic light-emitting layer, and a cathode. For example, in a case in which the display panel 120 is a liquid crystal display panel, the display element may be a liquid crystal display element. In addition, in a case in which the display panel 120 is a light-emitting display panel including an LED, the display element may be the LED. Hereinafter, the assumption is made that the display panel 120 is an organic light-emitting display panel. However, the display panel 120 is not limited to the organic light-emitting display panel. In addition, since the display device 100 is a rollable display device, the display panel 120 may be implemented as a flexible display panel so as to be wound around or unwound from the roller part, as described further below.

Referring to FIG. 2, the display panel 120 includes a display area AA and a non-display area NA.

The display area AA is an area of the display panel 120 in which images are displayed. The display area AA may include a plurality of pixels, a plurality of subpixels constituting the plurality of pixels, and a drive circuit configured to operate the plurality of subpixels. The plurality of subpixels may be minimum units constituting the display area AA. The display element may be disposed in each of the plurality of subpixels. For example, the plurality of subpixels may each include the light-emitting element, such as the anode, a light-emitting part, and a cathode. However, the present disclosure is not limited thereto. In addition, the circuit(s) configured to operate the plurality of subpixels may include driving elements, lines, and the like. For example, the circuit(s) may include, but are not limited to, a thin-film transistor, a storage capacitor, a gate line, a data line, and the like.

The non-display area NA is an area in which no image is displayed. The non-display area NA surrounds an outer periphery of the display area AA. Various lines and circuits for operating the organic light-emitting element (or some other type of display element) in the display area AA are disposed in the non-display area NA. For example, the non-display area NA may include, but is not limited to, link lines for transmitting signals to the plurality of subpixels and the circuit in the display area AA. The non-display area NA may include a drive IC such as a gate driver IC and a data driver IC.

The flexible film 130 is a film having various types of components disposed on a flexible base film (i.e., a base film having flexibility). The flexible film 130 may have ductility.

A partial region of the flexible film 130, together with a ductile area MA, may be wound around or unwound from the roller part. The flexible film 130 may supply signals to the plurality of subpixels and the circuit in the display area AA. The flexible film 130 may be electrically connected to the display panel 120. The flexible film 130 is disposed at one end of the non-display area NA of the display panel 120, such as at a bottom end of the non-display area NA of the display panel 120 in a non-limiting example, and supplies a power voltage, a data voltage, and the like to the plurality of subpixels and the circuit in the display area AA. The number of flexible films 130 illustrated in FIG. 2 is an example, and the number of flexible films 130 may be changed and selected in accordance with design. However, the present disclosure is not limited thereto.

Meanwhile, for example, the drive IC such as the gate driver IC and the data driver IC may also be disposed on the flexible film 130. The drive IC is a component configured to process data for displaying the image and process a driving signal for processing the data. The drive IC may be disposed in ways such as a chip-on-glass (COG) method, a chip-on-film (COF) method, and a tape carrier package (TCP) method depending on how the drive IC is mounted. However, for the convenience of description, the disclosure will proceed with a non-limiting example in which the drive IC is mounted on the flexible film 130 by the chip-on-film method. However, the present disclosure is not limited thereto.

The printed circuit board 140 is disposed at one end of the flexible film 130, such as at a bottom end of the flexible film 130 in a non-limiting example, and connected to the flexible film 130. The printed circuit board 140 is a component for supplying a signal to a drive IC. The printed circuit board 140 supplies various signals such as driving signal and data signals to the drive IC. Various types of components may be disposed on the printed circuit board 140. For example, a timing controller, a power source unit (which may also be referred to as a power source), and the like may be disposed on the printed circuit board 140. FIG. 2 illustrates one printed circuit board 140. However, the number of printed circuit boards 140 may be changed and selected in accordance with design. The present disclosure is not limited thereto.

Meanwhile, although not illustrated in FIG. 2, an additional printed circuit board connected to the printed circuit board 140 may be further disposed. For example, the printed circuit board 140 may be called a source printed circuit board ("source PCB" or "S-PCB") on which a data drive part is mounted. The additional printed circuit board connected to the printed circuit board 140 may be called a control printed circuit board ("control PCB" or "C-PCB") on which the timing controller and the like are mounted. The additional printed circuit board may be disposed in the roller part. The additional printed circuit board may be provided outside the roller part and disposed inside the housing part HP.

Referring to FIG. 3, the plurality of back bars 110 may be disposed on the rear surface of the display panel 120. The plurality of back bars 110 may support the display panel 120. When the display panel 120 is wound around or unwound from the roller part, the back bars 110 may support the display panel 120 and inhibit the display panel 120 from being scratched and damaged. In other words, the back bars 110 may provide a supporting or supportive force for the display panel 120. The plurality of back bars 110 may be referred to as an apron. The plurality of back bars 110 may be made of a plastic material. However, the present disclosure is not limited thereto. Meanwhile, the plurality of back bars 110 may be attached by a separate bonding layer or a foam tape, among other fasteners and fastening techniques.

FIGS. 2 and 3 illustrate that the plurality of back bars 110 are disposed on the rear surface of the display panel 120. In an embodiment, a back cover having a plurality of opening portions may be additionally disposed between the display panel 120 and the plurality of back bars 110. In addition, only the back cover may be used without the plurality of back bars 110 in some embodiments.

Coupling Structure Between Display Part, Roller Part, and Tape Spring

Figure 4A:
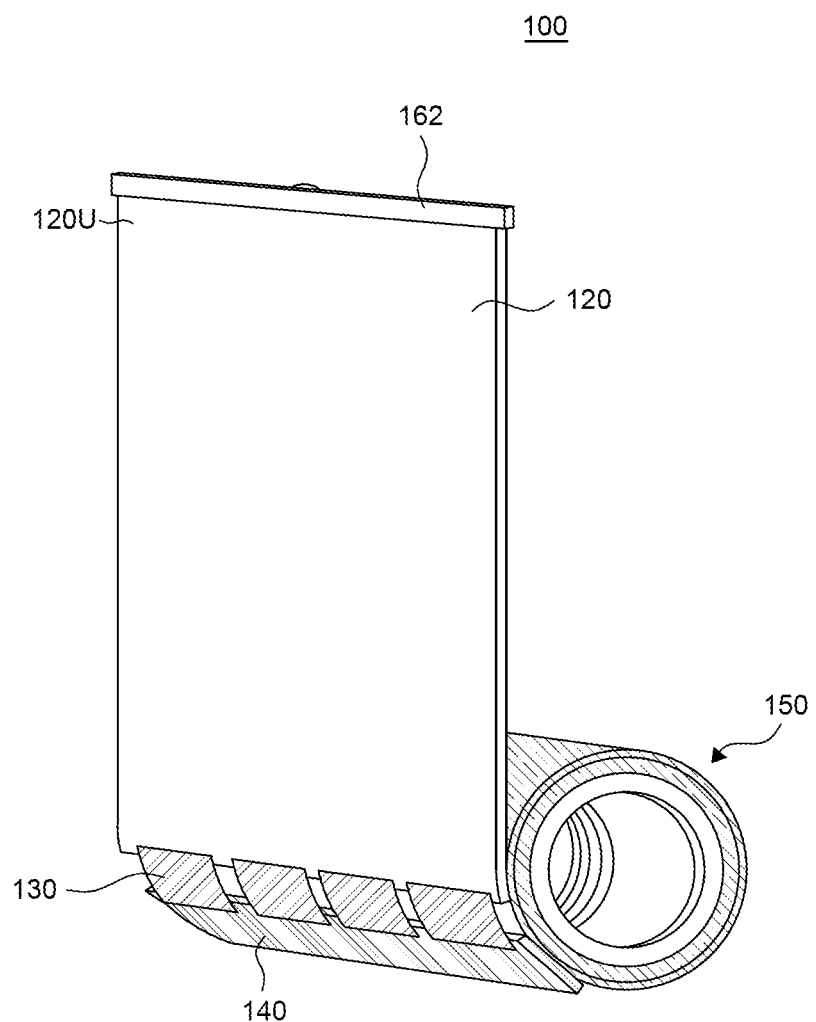
FIG. 4A is a front perspective view of the display of the display device of FIG. 1A separate from the housing.
Figure 4B:
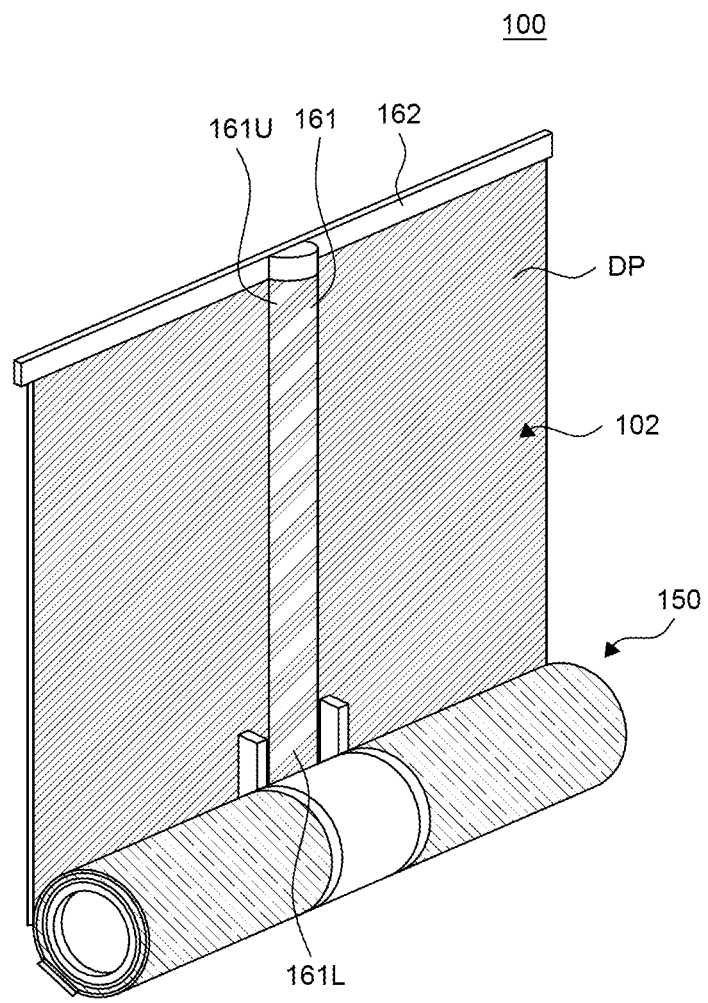
FIG. 4B is a rear perspective view of the display of the display device of FIG. 4A.

FIG. 4A is a front perspective view of the display device 100 uncoupled or separated from the housing part HP. FIG. 4B is a rear perspective view of the display device 100 uncoupled or separate from the housing part HP. FIGS. 4A and 4B provide additional detail of a coupling structure between the display part DP, a roller part 150 (which may also be referred to herein as a roller 150), and a tape spring 161 of the display device 100 according to one or more embodiments of the present disclosure.

Referring to FIGS. 4A and 4B, the display device 100 according to embodiments of the present disclosure includes the tape spring 161 and a head bar 162.

Referring to FIGS. 4A and 4B, the display part DP is connected to the roller part 150, and the roller part 150 is configured to wind or unwind the display part DP. The tape spring 161 may move the display part DP in the upward and/or downward direction in conjunction with the operation of the roller part 150. A specific method of operating the roller part 150 will be described with reference to FIGS. 10A and 10B, but the present disclosure is not limited thereto.

The tape spring 161 is disposed on a rear surface 102 of the display part DP. An upper end 161U of the tape spring 161 is fixed to an upper end 120U of the display panel 120. A lower end 161L of the tape spring 161 is fixed to the roller part 150. Therefore, the tape spring 161, together with the display part DP and display panel 120, may be wound around, or unwound from, the roller part 150 and move the display part DP in the upward and/or downward direction in conjunction with the operation of the roller part 150.

The tape spring 161 may be a bistable reeled composite ("BRC") member, among other possibilities. The tape spring 161 may be wound or unwound in a column direction, i.e., a longitudinal or vertical direction of the tape spring 161 while being rolled or unrolled in a row direction, i.e., a width or horizontal direction of the tape spring 161. When the tape spring 161 is kept unrolled (flat) in the row direction, the tape spring 161 is wound in the column direction. On the contrary, when the tape spring 161 is kept rolled in the row direction, the tape spring 161 has rigidity in the column direction and thus is unrolled in the longitudinal direction. In an embodiment, the tape spring 161 is pre-stressed and/or has elastic properties such that a shape of the tape spring 161 changes as the tape spring 161 is wound or unwound from the roller part 150. More specifically, when the tape spring 161 is wound about the roller part 150, the tape spring 161 flattens in a row direction (i.e., left to right in the orientation of FIGS. 4A and 4B) to evenly wrap around the roller part 150 in the flat configuration. As the tape spring 161 is unwound from the roller part 150, the tape spring 161 has a tendency to roll up into a rigid round tube structure, as shown at the upper end 161U of the tape spring 161. In this unrolled configuration, the tube structure of the tape spring 161 provides rigidity and support to the display part DP, and may in some instances assist with maintaining the display part DP in a flat configuration for viewing of images on the display panel 120 of the display part DP without distortion.

In this case, the rigidity of the tape spring 161 in the column direction is related to a degree to which the tape spring 161 is rolled in the row direction. That is, the degree to which the tape spring 161 is rolled in the row direction may be appropriately selected depending on the rigidity in the column direction that is suitable for the display part DP.

In the display device 100 according to the embodiment of the present disclosure, the tape spring 161 is unrolled or rolled in the row direction, such that the tape spring 161 may be wound or unwound in the column direction. Specifically, when the roller part 150 performs the winding operation, the tape spring 161, together with the display panel 120, may be wound in the column direction around the roller part 150. When the roller part 150 performs the unwinding operation, the tape spring 161, together with the display panel 120, may be unwound in the column direction from the roller part 150 (i.e., the column direction and row direction shown in FIG. 2 and FIG. 3).

In addition, when the roller part 150 performs the unwinding operation, the tape spring 161, which is unwound in the column direction, may have rigidity in the column direction, thereby restricting swaying and torsion of the unwound display panel 120. Therefore, the unwound display panel 120 may be kept flat by the rigidity of the tape spring 161 absent other external forces.

The head bar 162 may be disposed at an uppermost end of the display part DP. The head bar 162 is disposed to fix the display part DP and the upper end 161U of the tape spring 161. The head bar 162 may cover only a part of a surface of the display part DP adjacent to an edge of the uppermost end of the display part DP so as not to cover the image displayed on a front surface of the display part DP in some embodiments. For example, the display part DP and the head bar 162 may be fixed by a screw or other fastener, but the present disclosure is not limited thereto.

As shown in FIG. 4A and described in more detail elsewhere, the flexible film 130 and the printed circuit board are also configured to be wound and unwound about the roller part 150.

Hereinafter, a specific configuration of the roller part 150 will be described with reference to FIGS. 5 to 8B.

Configuration of Roller Part

Figure 5:
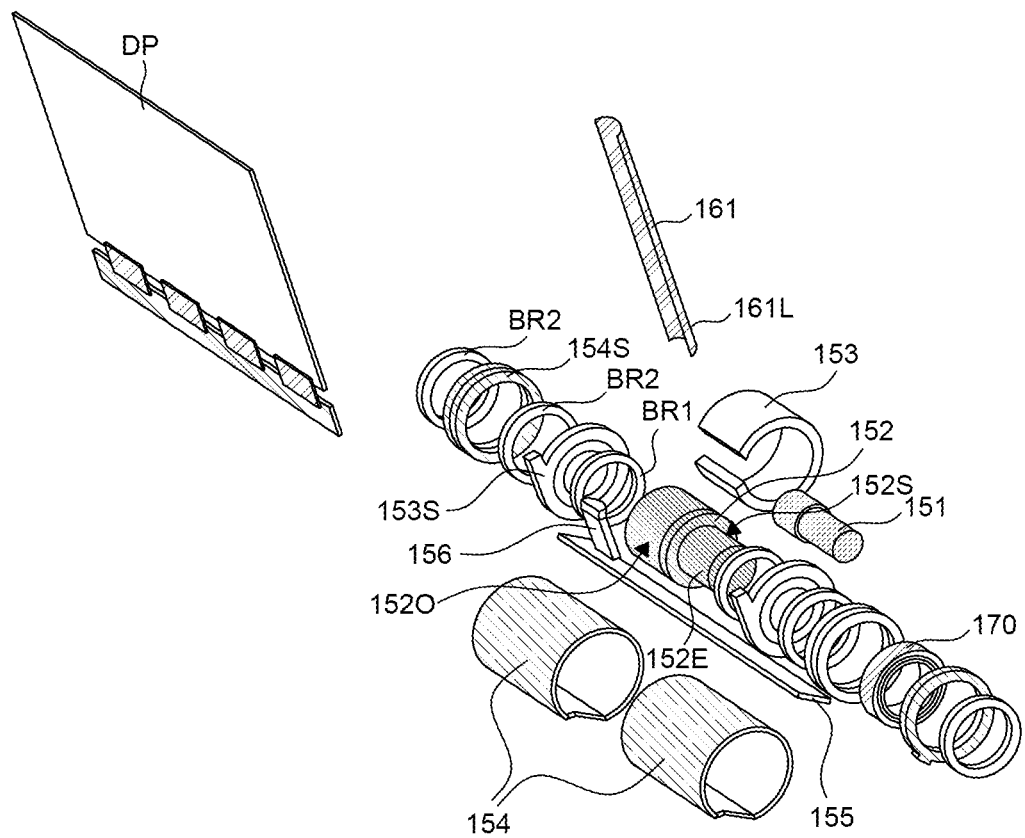
FIG. 5 is an exploded perspective view of the display of the display device of FIG. 1A.
Figure 6A:
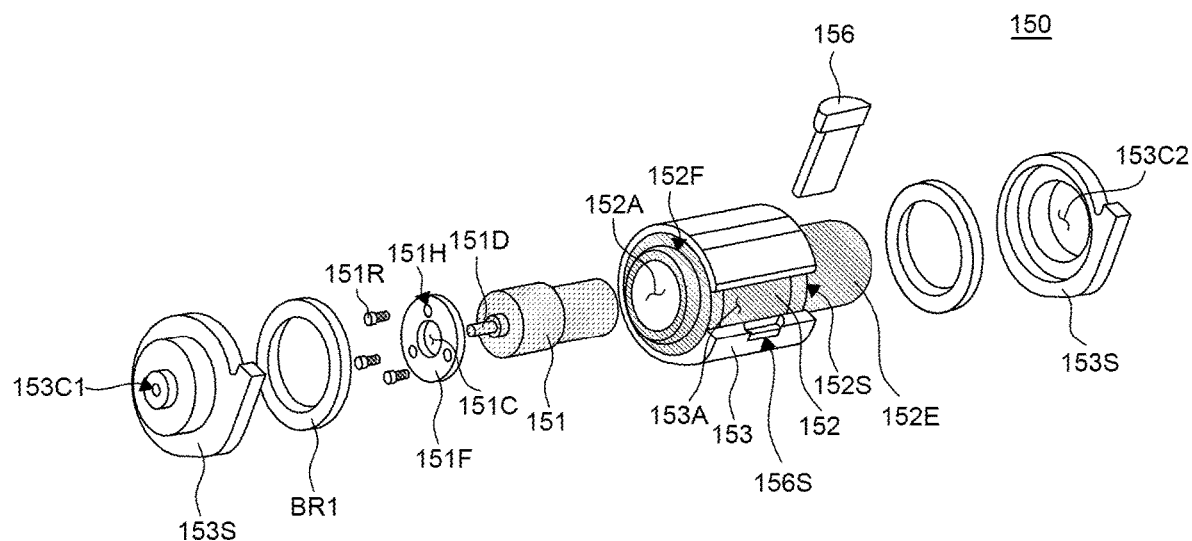
FIG. 6A is an exploded perspective view illustrating a motor, a tape spring drum, a tape spring casing, and a tape spring guide of a roller of the display device of FIG. 1A.
Figure 6B:
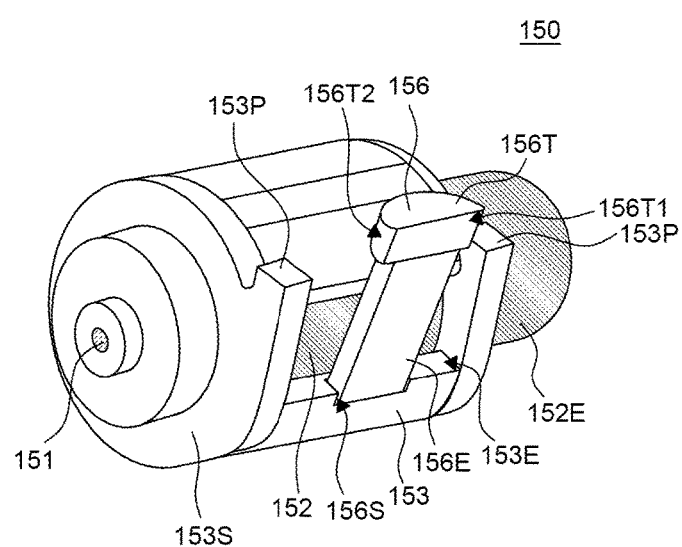
FIG. 6B is a perspective view of an assembled state of the motor, the tape spring drum, the tape spring casing, and the tape spring guide of the roller of the display device of FIG. 6A.
Figure 7A:
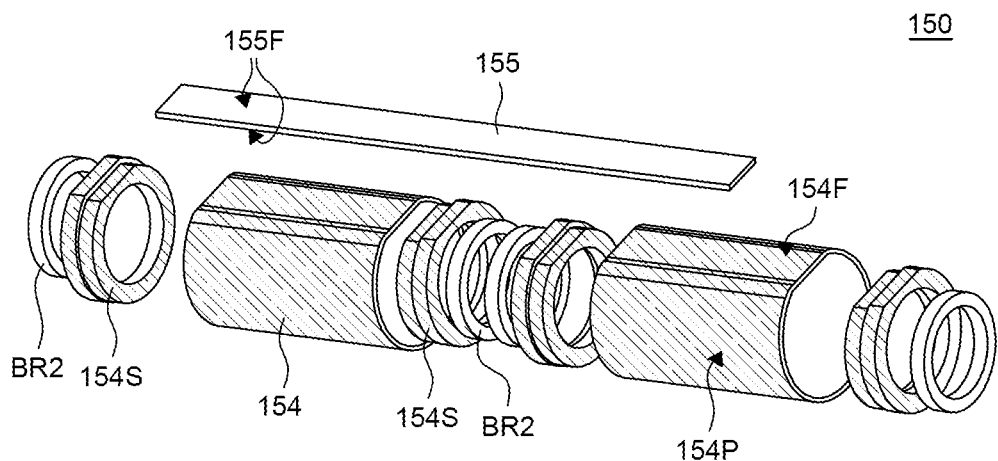
FIG. 7A is an exploded perspective view illustrating a base plate and a roll drum of the roller of the display device of FIG. 1A.
Figure 7B:
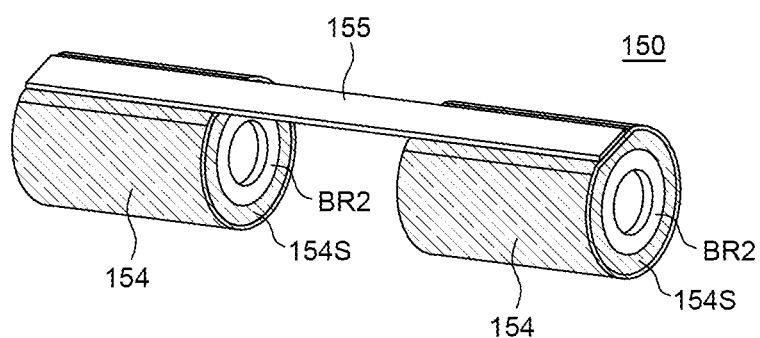
FIG. 7B is a perspective view illustrating an assembled state of the base plate and the roll drum of the roller of the display device of FIG. 7A.
Figure 8A:
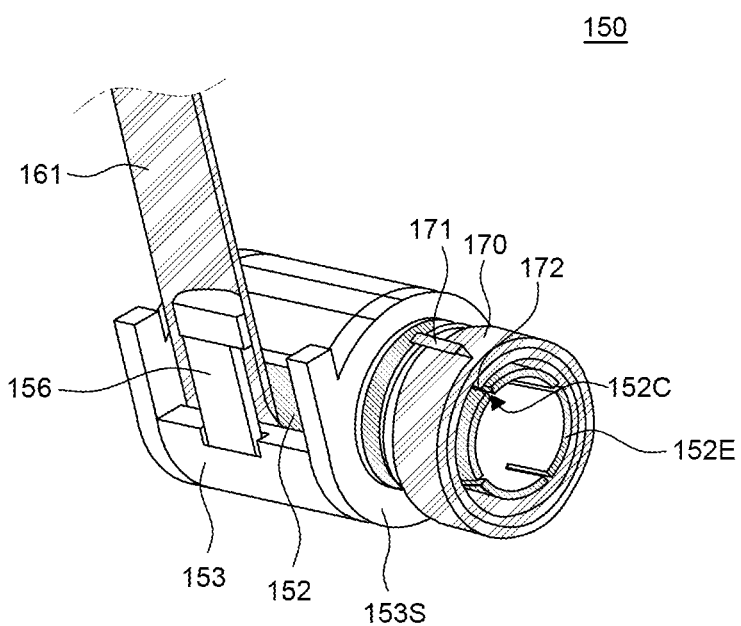
FIG. 8A is a perspective view illustrating a spiral spring disposed in the roller of the display device of FIG. 1A.
Figure 8B:
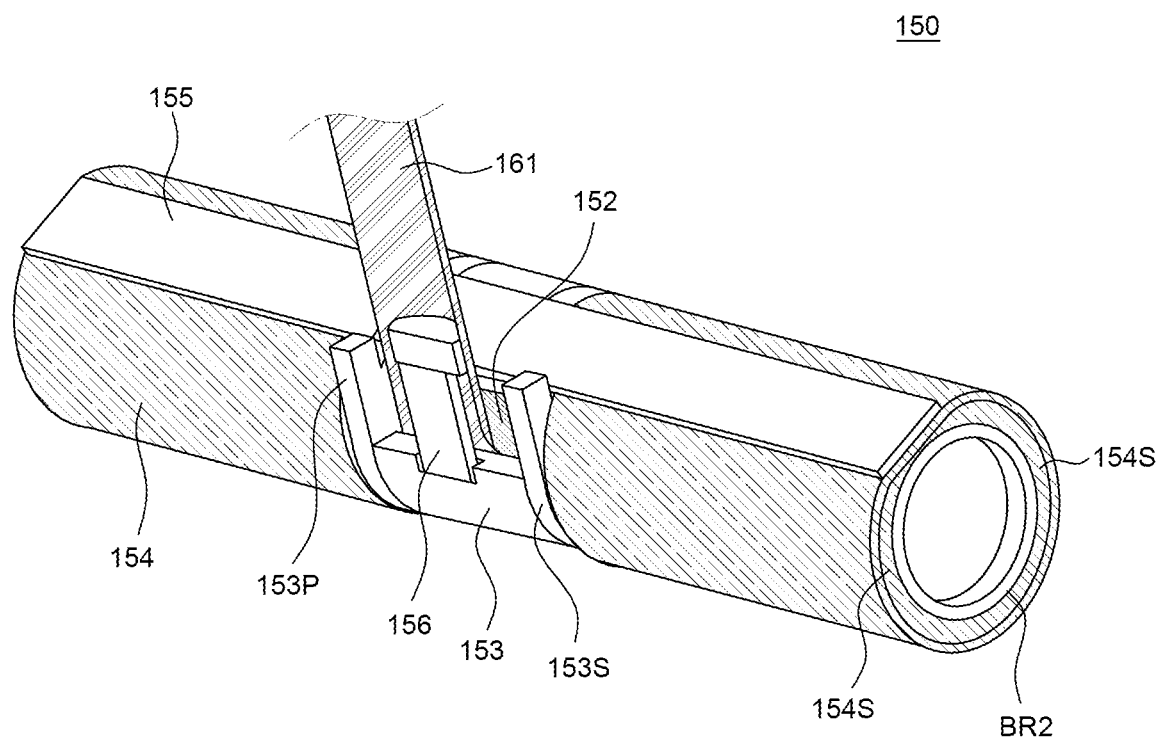
FIG. 8B is a perspective view of the roller of the display device of FIG. 1A.

FIG. 5 is an exploded perspective view of the display device 100 absent the housing part HP in one or more embodiments. FIG. 6A is an exploded perspective view illustrating a motor, a tape spring drum, a tape spring casing, and a tape spring guide of the roller part 150 of the display device 100 according to one or more embodiments of the present disclosure. FIG. 6B is a perspective view of an assembled state of the motor, the tape spring drum, the tape spring casing, and the tape spring guide of the roller part 150 of the display device 100 according to at least some embodiments of the present disclosure. FIG. 7A is an exploded perspective view illustrating a base plate and a roll drum of the roller part 150 of the display device 100 according to one or more embodiments of the present disclosure. FIG. 7B is a perspective view illustrating an assembled state of the base plate and the roll drum of the roller part 150 of the display device 100 according to some embodiments of the present disclosure. FIG. 8A is a perspective view illustrating a spiral spring disposed in the roller part 150 of the display device 100 according to one or more embodiments of the present disclosure. FIG. 8B is a perspective view of the roller part 150 of the display device 100 according to one or more embodiments of the present disclosure.

As will be explained in more detail with reference to FIGS. 5 to 8B, the roller part 150 may include a motor 151, a tape spring drum 152, a tape spring casing 153, a plurality of roll drums 154, a base plate 155, and a tape spring guide 156.

Beginning with FIGS. 5 to 6B, the motor 151 may be disposed at a central portion of the roller part 150 that is an innermost side of the roller part 150. In other words, the motor 151 may be an internal center of the roller part 150 with the other features of the roller part 150 arranged around, and to the outside of, the motor 151. The motor 151 may rotate the roller part 150 clockwise or counterclockwise. In an embodiment, the motor 151 is an electric motor operable to provide rotational force to rotate the roller part 150. The motor 151 may therefore be connected to a separate external power source or a power source integrated with the display device 100, such as an embedded battery, to supply the motor 151 with power.

Referring to FIGS. 5 and 6A, the tape spring drum 152 may have a generally cylindrical shape. The tape spring drum 152 is connected to the motor 151 while also accommodating the motor 151 inside an axial bore 152A of the tape spring drum 152. Specifically, as illustrated in FIG. 6A, the tape spring drum 152 may be connected to the motor 151 by a motor fixture 151F disposed on one side surface 152F (i.e., a first side surface 152F) of the tape spring drum 152 and configured to cover the motor 151. The motor fixture 151F may be disposed to fix the motor 151 to the tape spring drum 152. Therefore, the tape spring drum 152 may be rotated clockwise or counterclockwise by an operation of the motor 151. In an embodiment, the motor fixture 151F is provided in a form factor of a circular plate with holes 151H for receiving fasteners 151R to couple the tape spring drum 152 to the motor 151. The plate may have a size and arrangement that overlaps both a portion of the motor 151 and a portion of the tape spring drum 152 to facilitate the coupling. Further, the holes 151H may be arranged around a central hole 151C through the motor fixture 151F that accommodates a drive 151D of the motor 151 (i.e., the drive 151D passes through the central hole 151C) and enables the drive 151D to interface with other aspects of the motor part 151, as explained further elsewhere.

One end of the tape spring 161, such as the lower end 161L shown in FIG. 5, is fixed to the tape spring drum 152. When the tape spring drum 152 is rotated clockwise or counterclockwise by the motor 151, the tape spring 161 may be wound around or unwound from the tape spring drum 152 via the coupling between the lower end 161L of the tape spring 161 and the tape spring drum 152. That is, the tape spring drum 152 may be configured to wind or unwind the tape spring 161.

Meanwhile, a tape spring drum extension portion 152E having a shape extending outward may be disposed at the other side surface 152S (i.e., a second side surface 152S opposite to the first side surface 152F) of the tape spring drum 152. That is, as illustrated in FIGS. 6A and 6B, the tape spring drum extension portion 152E may be disposed to protrude outward from the other side surface 152S of the tape spring drum 152. In an embodiment, the tape spring drum 152 and tape spring drum extension portion 152E have different diameters to in a step down or step up configuration. In a non-limiting example, and as shown in FIG. 5, the tape spring drum 152 may have a diameter that is greater than a diameter of the tape spring drum extension portion 152E. Further, a spiral spring 170 may be disposed on the tape spring drum extension portion 152E (FIG. 5). Therefore, when the spiral spring is wound or unwound, the spiral spring 170 may maintain the display part DP in a flat state while applying tension to the display part DP. In this case, a specific configuration of the spiral spring 170 will be described below with reference to FIGS. 8A to 9C.

The tape spring casing 153 may be configured to accommodate the tape spring drum 152 and the tape spring 161. Specifically, the tape spring casing 153 may be disposed to surround an outer peripheral surface 152O of the tape spring drum 152. Further, the tape spring casing 153 may have a shape that enables the tape spring 161 to be wound around or unwound from the tape spring drum 152. For example, as illustrated in FIGS. 5 and 6A, the tape spring casing 153 may have a cylindrical shape having a C-shaped cross-section in order to provide a cylindrical outer surface for winding the tape spring 161 while also providing an aperture 153A so that the tape spring 161 can pass through the aperture 153A for attachment to the tape spring drum 162 accommodated in the tape spring casing 153. The tape spring casing 153 may also have a different shape that is at least partially opened so that the tape spring 161 may pass through the tape spring casing 153. However, the present disclosure is not limited thereto.

The tape spring casing 153 may be configured so as not to be rotated by the operation of the motor 151. For example, the tape spring casing 153 may be fixed inside the housing part HP. Therefore, the tape spring casing 153 may not rotate even though the tape spring drum 152 accommodated in the tape spring casing 153 is rotated by the operation of the motor 151. As a result, the tape spring casing 153 may be fixed and static, while also providing for rotational motion of the tape spring drum 152 inside the tape spring casing 153 via motor 151 to wind and unwind the tape spring 161 about the tape spring drum 152.

Referring to FIGS. 5 to 6B, a plurality of tape spring casing sides 153S may be disposed at two opposite sides of the tape spring casing 153. The tape spring casing sides 153S may cover side surfaces of the tape spring drum 152 and the motor 151 accommodated in the tape spring casing 153. Therefore, the plurality of tape spring casing sides 153S may be configured such that the motor 151 and the tape spring drum 152 are more stably accommodated in the tape spring casing 153. In this case, as illustrated in FIGS. 5 to 6B, the tape spring casing 153 and the plurality of tape spring casing sides 153S may be configured to be separable. However, the tape spring casing 153 and the plurality of tape spring casing sides 153S may be integrated as a single, unitary component. The present disclosure is not limited thereto. In an embodiment, the roller part 150 includes two tape spring casing sides 153S corresponding to opposite sides of the roller part 150 that may be different from each other. In the orientation of FIG. 6A and FIG. 6B, the left tape spring casing side 153S may be generally closed, except for a central hole 153C1 accommodating the drive 151D of the motor 151 and enabling rotational motion of the drive 151D relative to the left tape spring casing side 153S. The right tape spring casing side 153S may have a central hole 153C2 accommodating the tape spring drum extension portion 152E. As a result, a diameter of the hole 153C1 of the left tape spring casing side 153S is less than a diameter of the hole 153C2 of the right tape spring casing side 153S. Each of the tape spring casing sides 153S may also include a protrusion 153P, that may assist with securing the roller part 150 inside the housing part HP. The tape spring casing sides 153S may also have the same configuration, or some other arrangement, in some embodiments.

Meanwhile, referring to FIGS. 5 to 6B, a tape spring guide 156 (which may also be referred to herein as a guide 156 or guide element 156) may be further disposed on the tape spring casing 153. The tape spring guide 156 may be connected to the tape spring casing 153 at a position corresponding to the position of the tape spring 161 accommodated in the tape spring casing 153. In an embodiment, the tape spring guide 156 is received in a tape spring guide slot 156S (FIG. 6A) in the tape spring casing 153. The tape spring guide 156 includes an extension 156E and a tip 156T coupled to, or integrally formed with, with the extension 156E. The extension 156E may have a square or rectangular cross-sectional shape that is normal or perpendicular to a lower end face 153E of the tape spring casing 153 that includes the tape spring guide slot 156S. As a result, the extension 156E generally extends away from the tape spring casing 153 in a direction perpendicular to the end face 153E. The tip 156T of the tape spring guide 156 is positioned normal or perpendicular to the extension 153E and has a different shape than the extension 156E. More specifically, the tip 156T includes an outer surface including a flat and planar portion 156T1 that is similar to the outer surfaces of the extension 156E, except that the flat and planar portion 156T1 may have a greater width than surfaces of the extension 156E. The outer surface of the tip 156T further includes a curved portion 156T2 that may correspond to a curvature of the tape spring 161 in the unwound configuration. The flat and planar portion 156T1 may assist with accommodating the tape spring guide 156 inside the housing part HP, while the curved portion 156T2 may face the tape spring 161 and assist with guiding the tape spring 161, as described further with reference to FIG. 8A and FIG. 8B. Therefore, the tape spring guide 156 may guide an operation of winding or unwinding the tape spring 161 accommodated in the tape spring casing 153.

Referring to FIG. 6A, a plurality of first bearings BR1 may be disposed between the two opposite sides of the tape spring drum 152 and the plurality of tape spring casing sides 153S. The plurality of first bearings BR1 may support the two opposite sides of the tape spring drum 152 so that the tape spring drum 152 may rotate relative to the tape spring casing 153. In an embodiment, the first bearings BR1 are implemented as rings that reduce a coefficient of friction to support rotation of the tape spring drum 152 relative to the tape spring casing 153. The first bearings BR1 may include ball bearings, rollers, wheels, and the like.

Referring to FIG. 5, a plurality of second bearings BR2 may be disposed outside the plurality of tape spring casing sides 153S. The plurality of second bearings BR2 may support the plurality of roll drums 154 so that the plurality of roll drums 154 described further below may rotate relative to the tape spring casing 153. The second bearings BR2 may be the same as, or different from, the first bearings BR1. In an embodiment, the number and arrangement of the first and second bearings BR1, BR2 are selected based on design factors.

The plurality of roll drums 154 are disposed outside the plurality of second bearings BR2, which are disposed outside the plurality of tape spring casing sides 153S.

Referring to FIGS. 7A and 7B, the roll drums 154 may have a cylindrical shape as a whole, but a part of the roll drum 154 may have a flat surface. That is, a portion 154F of an outer peripheral surface 154P of the roll drum 154 is flat, and the remaining portion of the outer peripheral surface is curved. In an embodiment, and as illustrated in FIGS. 5 and 7A, the plurality of roll drums 154 may each include the roll drum 154 having a cylindrical shape, and roll drum sides 154S configured to cover side surfaces of the roll drum 154 and accommodate the second bearings BR2. However, the roll drum 154 and the roll drum sides 154S may be integrated as a single, unitary, integral component in some embodiments. The present disclosure is not limited thereto.

The plurality of roll drums 154 may be connected to the motor 151. For example, the plurality of roll drums 154 may be connected directly to the motor 151. Alternatively, the plurality of roll drums 154 may accommodate the motor 151 and be connected indirectly to the motor 151 by being connected to the tape spring drum 152, which is configured to be rotated by the motor 151. However, the method of connecting the plurality of roll drums 154 and the motor 151 may be variously changed in accordance with design and the present disclosure is not limited to the above non-limiting examples.

The plurality of roll drums 154 are connected to the motor 151, such that the plurality of roll drums 154 may be rotated clockwise or counterclockwise by the operation of the motor 151. In this case, the tape spring drum 152 and the plurality of roll drums 154, which accommodate the motor 151 and are rotated by the operation of the motor 151, may rotate in the same direction when the motor 151 operates. That is, the roll drums 154, which is configured to rotate in the same direction as the tape spring drum 152, may also be configured to rotate relative to the tape spring casing 153, which is held fixed in some embodiments.

Meanwhile, referring to FIGS. 5 and 7A, the plurality of second bearings BR2 in the roller part 150 may include a total of four second bearings BR2 respectively disposed at the two opposite sides of each of the plurality of roll drums 154. Therefore, the plurality of second bearings BR2 may support the two opposite sides of the plurality of roll drums 154 so that the plurality of roll drums 154 may rotate relative to the tape spring casing 153.

Referring to FIGS. 7A and 7B, the base plate 155 may be connected to the plurality of roll drums 154 and include a planar portion, such as opposing flat and planar major surfaces 155F where "major" means the largest surface area of any surface of the base plate 155. Specifically, the base plate 155 may be disposed on the flat portion 154F of the outer peripheral surface 154P of each of the plurality of roll drums 154.

The printed circuit board 140 of the display part DP may be disposed on the planar portion 155F of the base plate 155. Therefore, when the roller part 150 performs the winding or unwinding operation, the planar portion of the base plate 155 may support the printed circuit board 140 in a flat shape among the components of the display part DP wound around the roller part 150.

Referring to FIGS. 8A and 8B, the spiral spring 170 may be disposed on the tape spring drum extension portion 152E. Specifically, one end 171 (i.e., a first send 171) of the spiral spring 170 is connected to the roll drum 154, and the other end 172 (i.e., a second end 172) of the spiral spring 170 is connected to the tape spring drum 152. That is, the spiral spring 170 may be disposed in a space between the roll drum 154 and the tape spring drum extension portion 152E. For example, one end 171 of the spiral spring 170 may be connected to the roll drum 154 by being inserted into an opening portion formed in the roll drum 154. The other end 172 of the spiral spring 170 may be connected to the tape spring drum extension portion 152E by being inserted into an opening portion formed in the tape spring drum extension portion 152E. In an embodiment, the ends 171, 172 of the spiral spring 170 are implemented as a bent tab with a "C"-shaped cross section that are inserted into corresponding slits or channels 152C in the roll drum 154 and the tape spring drum extension portion 152E to couple the spiral spring 170 to the roll drum 154 and the tape spring drum extension portion 152E. However, the present disclosure is not limited thereto and other configurations are possible, including the use of various fasteners, tapes, adhesives, and the like.

The spiral spring 170 is a spiral member having an elastic force. The spiral spring 170 may apply a force in a winding direction of the roller part 150 by using tension of the spring. That is, the elastic force accumulated in the spiral spring 170 may increase when the display part DP is wound. Therefore, when the display part DP is fully unwound, the tension is released and applied to the display part DP, such that the display part DP may be kept flat. Further, the display part DP may be more easily wound.

FIG. 8B illustrates the assembled roller part 150 with the roller drums 154 coupled to opposite sides of the tape spring casing 153 and the base plate 155 coupled to the flat portions 154F of the roller drums 154 and extending across the tape spring casing 153. In an embodiment, the base plate 155 provides additional rigidity to the roller part 155 and also enables uniform rolling of the roller part 150, in addition to the features and benefits described above. The tape spring casing 153 may be held static or stationary by the housing part HP while the remaining portions of the roller part 150 rotate to wind or unwind the display part DP about the roller part 150, and also to wind and unwind the tape spring 161 about the tape spring drum 152.

Hereinafter, a specific operation of the spiral spring 170 will be described with reference to FIGS. 9A to 9C.

Operation of Spiral Spring

Figure 9A:
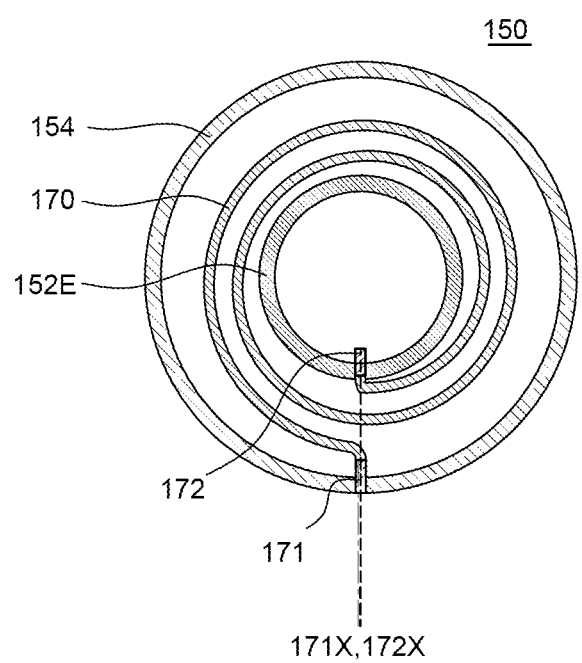
FIGS. 9A to 9C are cross-sectional views illustrating an operation of the spiral spring during a winding or unwinding operation of the roller of the display device of FIG. 1A.
Figure 9B:
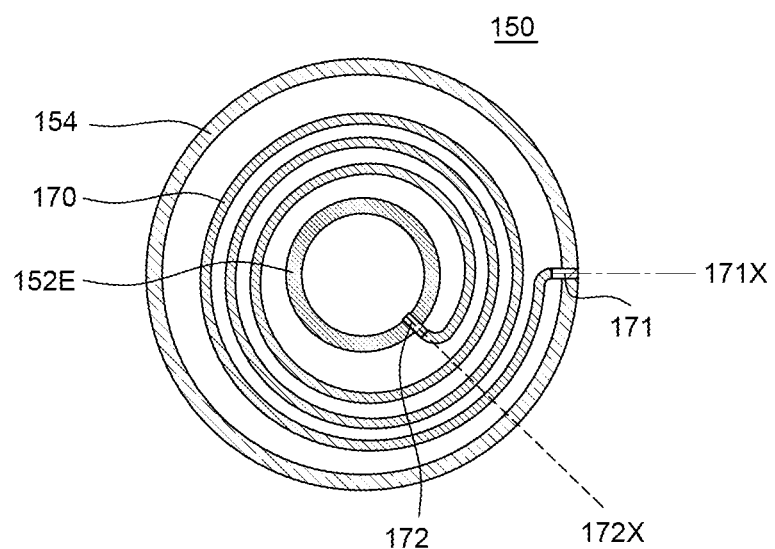
Figure 9C:
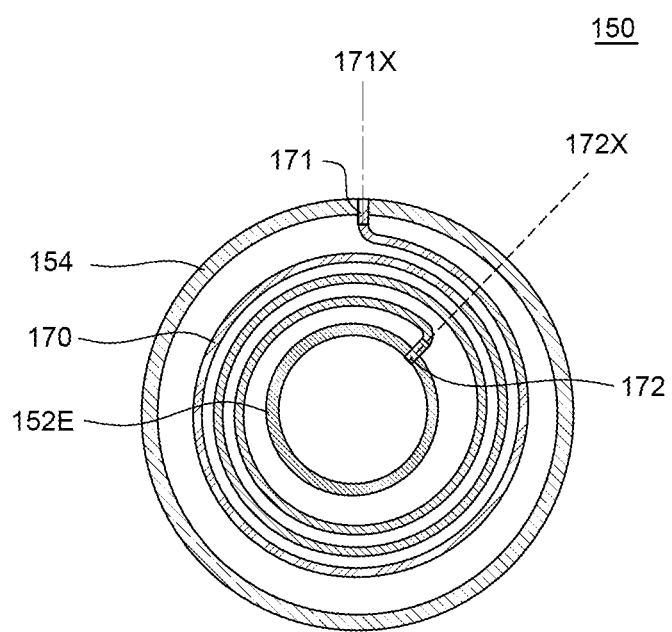

FIGS. 9A to 9C are cross-sectional views illustrating an operation of the spiral spring 170 during a winding or unwinding operation of the roller part 150 of the display device 100. For the convenience of description, FIGS. 9A to 9C illustrate only the spiral spring 170, the tape spring drum extension portion 152E, and the roll drum 154 of the roller part 150 among the components of the display device 100.

Referring to FIGS. 9A to 9C, in the display device 100, both the roll drum 154 connected to one end 171 of the spiral spring 170 and the tape spring drum extension portion 152E connected to the other end 172 of the spiral spring 170 are configured to rotate. That is, both one end 171 and the other end 172 of the spiral spring 170 are configured to be rotatable. Therefore, energy stored in the spiral spring 170 may be maintained at a predetermined level. Further, it is possible to compensate for a difference in slip between the display part DP and the roller part 150 without causing damage to the display part DP.

Referring to FIG. 9A, in the display device 100 according to at least one embodiment, a central axis 171X through the one end 171 of the spiral spring 170 may be disposed on the same line as, or aligned with and parallel to, a central axis 172X through the other end 172 of the spiral spring 170.

Referring to FIG. 9B, when the roll drum 154 rotates counterclockwise by 90 degrees, the one end 171 of the spiral spring 170 may rotate counterclockwise by 90 degrees, and the other end 172 of the spiral spring 170 may rotate counterclockwise by about 45 degrees due to the difference in diameter between the roll drum 154 and the tape spring drum extension portion 152E. The one end 171 of the spiral spring 170 connected to the roll drum 154 may rotate together with the roll drum 154. The other end 172 of the spiral spring 170 connected to the tape spring drum extension portion 152E may rotate as the energy stored in the spiral spring 170 increases to a predetermined level associated with rotation of the tape spring drum extension portion 152E, or higher. Specifically, when the roll drum 154 and the one end 171 of the spiral spring 170 begin to rotate, the spiral spring 170 may be further wound around the tape spring drum extension portion 152E, and the energy stored in the spiral spring 170 may therefore gradually increase. The spiral spring 170 is characterized by returning back to the original state when the spiral spring 170 is deformed by an external force. Therefore, when the spiral spring 170 is deformed as the one end 171 of the spiral spring 170 is rotated by an external force applied to the roll drum 154, the other end 172 of the spiral spring 170 may rotate in the same direction as the one end 171 of the spiral spring 170 so that the spiral spring 170 returns to the original state, i.e., the state illustrated in FIG. 9A in which the central axis 171X of one end 171 of the spiral spring 170 and the central axis 172X of the other end 172 of the spiral spring 170 are disposed on the same line.

In an embodiment, the other end 172 of the spiral spring 170 may not rotate simultaneously together with the one end 171 of the spiral spring 170. However, the other end 172 of the spiral spring 170 may rotate when the energy stored in the spiral spring 170 increases to a predetermined level or higher. Specifically, the other end 172 of the spiral spring 170 is fixed to the tape spring drum extension portion 152E, and a predetermined force is utilized to rotate the tape spring drum extension portion 152E. Therefore, the other end 172 of the spiral spring 170 and the tape spring drum extension portion 152E may rotate after additional energy capable of rotating the tape spring drum extension portion 152E is stored in the spiral spring 170 by rotation of the one end 171.

Referring to FIG. 9C, when the roll drum 154 rotates by an additional 90 degrees counterclockwise, the one end 171 of the spiral spring 170 may further rotate by 90 degrees counterclockwise, and the other end 172 of the spiral spring 170 may rotate counterclockwise while maintaining an angle at a predetermined level with respect to the one end 171 of the spiral spring 170. There may be a difference of about 45 degrees between the central axis 171X of one end 171 of the spiral spring 170 connected to the roll drum 154 and the central axis 172X of the other end 172 of the spiral spring 170 connected to the tape spring drum extension portion 152E in some embodiments. The difference may also be about 45 degrees (i.e., between 42 degrees and 48 degrees) or more or less than 45 degrees, such as any value between and including 25 degrees to 65 degrees, among others. Even though the one end 171 of the spiral spring 170 and the roll drum 154 continuously rotate, a difference in angle is maintained at a predetermined level between the central axis 171X of the one end 171 of the spiral spring 170 and the central axis 172X of the other end 172 of the spiral spring 170. Therefore, the energy stored in the spiral spring 170 may be maintained at a predetermined level that is associated with a difference between the central axis 171X and the central axis 172X being approximately 45 degrees in some embodiments. In the display device 100 according to at least some embodiments of the present disclosure, the tape spring drum extension portion 152E and the roll drum 154 are rotatably connected, and both the one end 171 and the other end 172 of the spiral spring 170 are configured to be rotatable. Therefore, it is possible to maintain a tensile force of the spiral spring 170 at a level that may compensate for a slip of the display part DP and a slip of the roller part 150 without damaging the display part DP. In other words, the stored energy in the spiral spring 170 during rotation of the roller part 150 is maintained throughout rotation of the roller part 150 in order to maintain a tensile force in the spiral spring 170 that compensates for a slip of the display part DP and a slip of the roller part 150 during operation.

Winding and Unwinding Operations of Roller Part

Figure 10A:
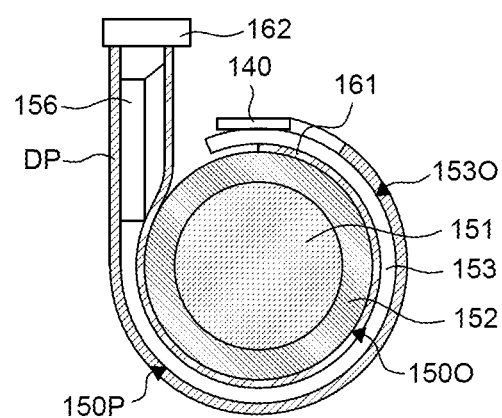
FIGS. 10A and 10B are cross-sectional views illustrating the winding and unwinding operations of the roller of the display device of FIG. 1A.
Figure 10B:
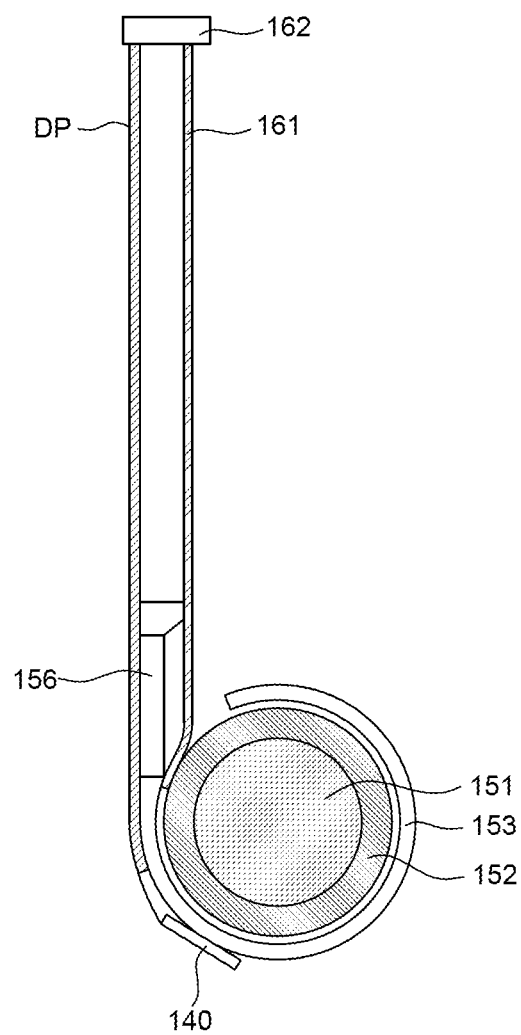

FIGS. 10A and 10B are cross-sectional views illustrating the winding and unwinding operations of the roller part 150 of the display device 100 according to one or more embodiments of the present disclosure. For the convenience of description, FIGS. 10A and 10B illustrate only the motor 151, the tape spring drum 152, the tape spring casing 153, and the tape spring guide 156 among the components of the roller part 150.

Referring to FIGS. 10A and 10B, in the display device 100 according to the present disclosure, when the roller part 150 performs the winding or unwinding operation, the display part DP may be wound around or unwound from the outer peripheral surface of the roller part 150, and the tape spring 161 connected to the head bar 162 may be disposed to be accommodated in the roller part 150, or to extend from the roller part 150, respectively.

First, referring to FIG. 10A, the tape spring 161 may be accommodated in the roller part 150 when the roller part 150 is wound. Specifically, the tape spring 161 may be accommodated between the tape spring drum 152, which is rotated by the motor 151, and the tape spring casing 153 that is fixed in the housing part HP so as not to rotate in the display device 100. In an embodiment, the tape spring 161 may be connected to the tape spring drum 152 and wound around the outer peripheral surface 1520 of the tape spring drum 152.

Further, the display part DP, which is connected to the tape spring 161 by the head bar 162, may be wound around an outer peripheral surface 150P of the roller part 150. That is, the display part DP may be disposed along an outer peripheral surface 1530 of the tape spring casing 153 of the roller part 150. Although not illustrated in FIG. 10A, the display part DP may be connected to the plurality of roll drums 154 disposed at the two opposite sides of the tape spring casing 153, connected to the motor 151 disposed in the tape spring casing 153, and configured to rotate. Therefore, even though the tape spring casing 153 is fixedly disposed so as not to rotate in the display device 100, the display part DP may be wound along the outer peripheral surface of the tape spring casing 153 by the rotation of the plurality of roll drums 154.

Next, referring to FIG. 10B, the tape spring 161 may be extended from the inside of the roller part 150 when the roller part 150 performs the unwinding operation. Specifically, the tape spring 161 may be unwound from the tape spring drum 152 by the rotation of the tape spring drum 152. In this case, the tape spring 161 may be unwound from the tape spring drum 152 and unrolled in the width direction by the tape spring guide 156 while maintaining rigidity in the upward/downward direction.

As a result, the head bar 162 connected to the upper end of the tape spring 161 may move in the upward direction. The display part DP connected to the head bar 162 may also move in the upward direction, with the weight of the head bar 162 and the display part DP being supported, at least in part, by the tape spring 161. Therefore, the display part DP may be unwound from the outer peripheral surface 1530 of the tape spring casing 153 of the roller part 150.

Meanwhile, referring to FIGS. 10A and 10B, the display part DP may have a length and the roller part 150 may have a circumference such that roller part 150 rotates once to fully wind the display part DP along the outer peripheral surface of the roller part 150. In other words, the length of the display part DP corresponds to a circumference of the roller part 150 in an embodiment. Such an arrangement is also preferable to prevent interference between the base plate 155 and the protrusions 153P of the tape spring casing sides 153S. In an embodiment, the protrusions 153P prevent over rotation of the roller part 150 through contact with the base plate 155. Therefore, the display part DP may more stably move downward or upward relative to the roller part 150 when the roller part 150 performs the winding or unwinding operation.

In the display device 100 according to embodiments of the present disclosure, the roller part 150, which winds or unwinds the display part DP, and the motor 151, which operates the tape spring 170 that moves the display part DP in the upward/downward direction, are disposed in the same space. In other words, the motor 151 is internal the tape spring casing 153 of the roller part 150, and the tape spring 170 is positioned inside roller drums 154 coupled to the tape spring casing 153 to reduce the space occupied by the roller part 150. Therefore, it is possible to minimize an operational space of the display device 100.

In a display device in the related art, a motor is provided to operate a lifting part for moving a display part in an upward/downward direction, a roller part is provided to wind or unwind the display part, and the motor and the roller part are separately disposed. That is, when a shaft of the motor rotates, the lifting part moves in the upward/downward direction, such that the display part connected to the lifting part is wound around or unwound from the roller part. Therefore, in the display device in the related art, separate spaces in which the motor and the roller part are respectively disposed are required. For this reason, there are problems in that it is difficult to ensure spatial utilization of the display device, and an overall volume of the display device increases.

Therefore, in the display device 100 according to embodiments of the present disclosure, the tape spring 161 may be applied as a lifting part for moving the display part DP in the upward and/or downward direction, and the tape spring 161 may also be accommodated in the roller part 150 to reduce space. The display part DP is wound around or unwound from the outer peripheral surface 150P of the roller part 150 that accommodates the motor 151 and is rotated by the motor 151. Therefore, the motor 151 is configured to move the tape spring 161 in the upward and/or downward direction and is accommodated in the roller part 150 and rotated together with the roller part 150, such that the motor 151 and the roller part 150 may be integrated. Therefore, in the display device 100 according to embodiments of the present disclosure, the roller part 150, which winds or unwinds the display part DP, and the motor 151, which operates the tape spring 161 that moves the display part DP in the upward and/or downward direction, are disposed in the same space. Therefore, it is possible to minimize an operational space for the display device 100 and improve the spatial utilization of the display device 100.

Figure 11A:
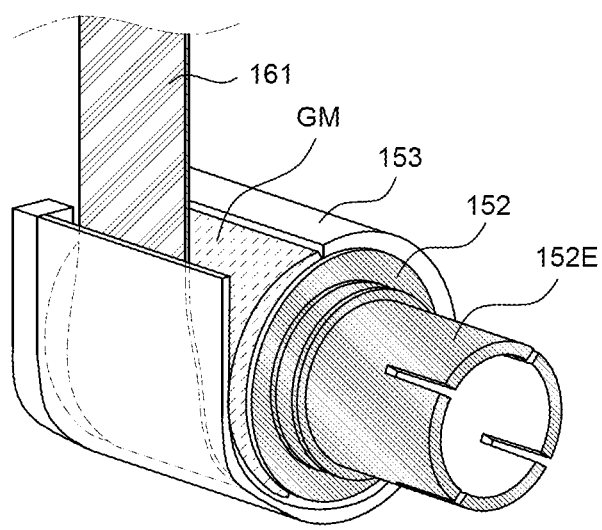
FIG. 11A is a perspective view of a roller of a display device according to an embodiment of the present disclosure.
Figure 11B:
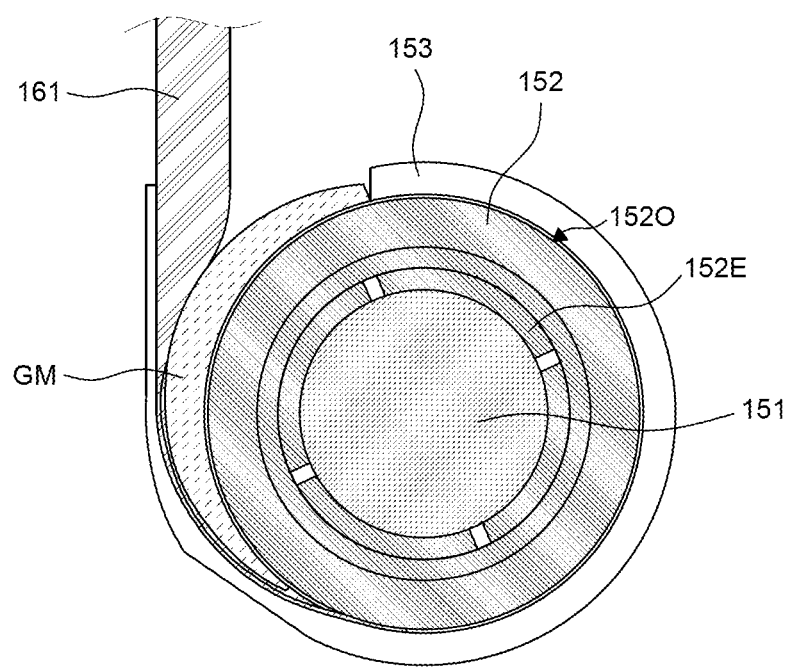
FIG. 11B is a cross-sectional view of the roller of the display device of FIG. 11A.

FIG. 11A is a perspective view of a roller part of a display device 1100 according to an embodiment of the present disclosure. FIG. 11B is a cross-sectional view of the roller part of the display device 1100 according to the present disclosure. The display device 1100 illustrated in FIGS. 11A and 11B may be substantially identical in configuration to the display device 100 illustrated in FIGS. 1A to 10B, except as otherwise provided below. Therefore, repeated descriptions of the identical components will be omitted.

Referring to FIGS. 11A and 11B, the roller part 150 may further include a guide member GM.

In the display device 1100 according to embodiments of the present disclosure, the guide member GM is further disposed between the tape spring drum 152 and the tape spring casing 153, such that the tape spring 161 may be more stably wound or unwound.

Specifically, the guide member GM may be disposed between the tape spring drum 152 and the tape spring casing 153 and configured to guide the tape spring 161. The guide member GM may be additionally disposed on a part of the outer peripheral surface 1520 of the tape spring drum 152 and mitigate a rapid change in shape that occurs when the tape spring 161, which is disposed between the tape spring drum 152 and the tape spring casing 153, is unwound. In an embodiment, and referring to FIG. 11B, an outer surface of the guide member GM is formed as a curved surface, and a curvature of the curved outer surface of the guide member GM may be different from a curvature of the outer peripheral surface 1520 of the tape spring drum 152. Therefore, the guide member GM may assist with gradually forming the curved shape of the tape spring 161 when the tape spring 161 is unwound. Therefore, in the display device 1100 according to an embodiment of the present disclosure, the guide member GM is further disposed between the tape spring drum 152 and the tape spring casing 153, such that the tape spring 161 may be more stably wound or unwound, and the display device 1100 may be more stably operated.

Additional features related to the disclosure herein are described in U.S. patent application Ser. No. 17/977,868 filed on Oct. 31, 2022 in the U.S. Patent Office, titled: Display Device, with a claim of priority to Korean Patent Application No. 10-2021-0193484 filed on Dec. 30, 2021, in the Korean Intellectual Property Office; the entire contents of which are incorporated herein by reference.

The example embodiments of the present disclosure can also be described and/or summarized as follows.

According to one or more embodiments of the present disclosure, a display device includes: a display including a display panel configured to display an image; a roller configured to wind or unwind the display; and a tape spring configured to move the display part in an upward direction or a downward direction in conjunction with the roller, wherein the roller includes a motor; a tape spring drum accommodating the motor and connected to the motor, a first end of the tape spring being fixed to the tape spring drum, and the tape spring drum configured to wind or unwind the tape spring; a tape spring casing accommodating the tape spring drum and the tape spring; and a plurality of roll drums connected to opposite sides of the motor.

The roller part may further comprise a tape spring guide connected to the tape spring casing, the tape spring guide configured to guide a winding or unwinding operation of the tape spring, the tape spring accommodated in the tape spring casing.

The display device may further comprise a printed circuit board connected to the display and configured to supply a signal to the display.

The roller part may further comprise a base plate connected to the plurality of roll drums, the base plate having a planar portion for supporting the printed circuit board, and wherein the printed circuit board may be disposed on the planar portion of the base plate.

The display has a length that rotates once along an outer peripheral surface of the roller in response to the display being wound.

The roller part may further comprise a guide member disposed between the tape spring drum and the tape spring casing, the guide member configured to guide the tape spring.

An outer surface of the guide member is a curved surface, and a curvature of the curved surface is different from a curvature of an outer peripheral surface of the tape spring drum.

The roller part may further comprise a spiral spring having an elastic force, wherein a first end of the spiral spring is connected to one of the plurality of roll drums and a second end of the spiral spring is connected to the tape spring drum.

The tape spring drum may comprise an extension portion extending from an inside of the tape spring casing to an outside of the tape spring casing, and the second end of the spiral spring is connected to the extension portion of the tape spring drum.

The tape spring is configured to accumulate elastic force in response to the display being wound.

The roller part may further comprise a plurality of first bearings disposed at two opposite sides of the tape spring drum, the plurality of first bearings configured to support the tape spring drum and enable rotation of the tape spring drum relative to the tape spring casing.

The roller part may further comprise a plurality of second bearings disposed at two opposite sides of each of the plurality of roll drums and configured to support two opposite sides of each of the roll drums and enable rotational motion of the plurality of roll drums relative to the tape spring casing.

The roller part may further comprise a motor fixture connected to the tape spring drum and configured to cover the motor disposed in the tape spring drum.

According to one or more embodiments of the present disclosure, a display device includes: a display configured to display an image; a tape spring coupled to the display; and a roller configured to wind or unwind the display and the tape spring, the roller including a motor, a tape spring drum accommodating the motor and connected to the motor, the tape spring drum configured to wind or unwind the tape spring, a tape spring casing accommodating the tape spring drum and the tape spring, and a plurality of roll drums connected to opposite sides of the motor.

The roller may further includes a spiral spring coupled to one of the plurality of roll drums and the tape spring drum, the spiral spring configured to accumulate elastic force in response to the display being wound about the roller.

The roller may further include a base plate coupled to a flat portion of the plurality of roll drums, the base plate having at least one planar surface.

The display device may further comprise a printed circuit board coupled to the display, the printed circuit board disposed on the at least one planar surface of the base plate.

The display may have a length that corresponds to a circumference of the roller.

According to one or more embodiments of the present disclosure, a display device includes: a roller configured to wind or unwind a display and a tape spring coupled to the display, the roller including a tape spring casing, a tape spring drum configured to wind or unwind the tape spring, at least a portion of the tape spring drum being internal to the tape spring casing, a motor connected to the tape spring drum, at least a portion of the motor being internal to the tape spring drum, and a roll drum connected to the motor.

The roller may further include a guide element having at least one curved surface configured to guide a curved surface of the tape spring.

The roller may further include a spiral spring coupled to the roll drum and the tape spring drum, the spiral spring configured to accumulate elastic force as a result of a difference in diameter between the roll drum and the tape spring drum.

The roller may have a flat portion and the display device may further comprise a printed circuit board coupled to the display, the printed circuit board disposed on the flat portion of the roller.

In one more embodiments of the present disclosure, a display device includes: a display configured to display an image; a tape spring coupled to the display; and a roller configured to wind or unwind the display and the tape spring, the roller including a motor, a tape spring drum accommodating the motor and connected to the motor, the tape spring drum configured to wind or unwind the tape spring, a tape spring casing accommodating the tape spring drum and the tape spring, and a plurality of roll drums connected to opposite sides of the motor.

The roller may further include a spiral spring coupled to one of the plurality of roll drums and the tape spring drum, the spiral spring configured to accumulate elastic force in response to the display being wound about the roller.

The roller may further include a base plate coupled to a flat portion of the plurality of roll drums, the base plate having at least one planar surface, the display device further comprising a printed circuit board coupled to the display, the printed circuit board disposed on the at least one planar surface of the base plate.

The display may have a length that corresponds to a circumference of the roller.

In one or more embodiments of the present disclosure, a display device includes: a roller configured to wind or unwind a display and a tape spring coupled to the display, the roller including a tape spring casing, a tape spring drum configured to wind or unwind the tape spring, at least a portion of the tape spring drum being internal to the tape spring casing, a motor connected to the tape spring drum, at least a portion of the motor being internal to the tape spring drum, and a roll drum connected to the motor.

The roller may further include a guide element having at least one curved surface configured to guide a curved surface of the tape spring.

The roller may further include a spiral spring coupled to the roll drum and the tape spring drum, the spiral spring configured to accumulate elastic force as a result of a difference in diameter between the roll drum and the tape spring drum.

The roller may have a flat portion, the display device further comprising a printed circuit board coupled to the display, the printed circuit board disposed on the flat portion of the roller.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a display including a display panel configured to display an image;
    a roller configured to wind or unwind the display; and
    a tape spring configured to move the display part in an upward direction or a downward direction in conjunction with the roller,
    wherein the roller includes:
        a motor;
        a tape spring drum accommodating the motor and connected to the motor, a first end of the tape spring being fixed to the tape spring drum, and the tape spring drum configured to wind or unwind the tape spring;
        a tape spring casing accommodating the tape spring drum and the tape spring; and
        a plurality of roll drums connected to opposite sides of the motor.

2. The display device of claim 1, wherein the roller further includes a tape spring guide connected to the tape spring casing, the tape spring guide configured to guide a winding or unwinding operation of the tape spring, the tape spring accommodated in the tape spring casing.

3. The display device of claim 1, further comprising:
    a printed circuit board connected to the display and configured to supply a signal to the display,
    wherein the roller further includes a base plate connected to the plurality of roll drums, the base plate having a planar portion for supporting the printed circuit board, and
    wherein the printed circuit board is disposed on the planar portion of the base plate.

4. The display device of claim 1, wherein the display has a length that rotates once along an outer peripheral surface of the roller in response to the display being wound.

5. The display device of claim 1, wherein the roller further includes a guide member disposed between the tape spring drum and the tape spring casing, the guide member configured to guide the tape spring.

6. The display device of claim 5, wherein an outer surface of the guide member is a curved surface, and a curvature of the curved surface is different from a curvature of an outer peripheral surface of the tape spring drum.

7. The display device of claim 1, wherein the roller further includes a spiral spring having an elastic force, wherein a first end of the spiral spring is connected to one of the plurality of roll drums and a second end of the spiral spring is connected to the tape spring drum.

8. The display device of claim 7, wherein the tape spring drum includes an extension portion extending from an inside of the tape spring casing to an outside of the tape spring casing, and the second end of the spiral spring is connected to the extension portion of the tape spring drum.

9. The display device of claim 7, wherein the spiral spring is configured to accumulate elastic force in response to the display being wound.

10. The display device of claim 1, wherein the roller further comprises a plurality of first bearings disposed at two opposite sides of the tape spring drum, the plurality of first bearings configured to support the tape spring drum and enable rotation of the tape spring drum relative to the tape spring casing.

11. The display device of claim 10, wherein the roller further includes a plurality of second bearings disposed at two opposite sides of each of the plurality of roll drums and configured to support two opposite sides of each of the roll drums and enable rotational motion of the plurality of roll drums relative to the tape spring casing.

12. The display device of claim 1, wherein the roller further includes a motor fixture connected to the tape spring drum and configured to cover the motor disposed in the tape spring drum.

13. A display device comprising:
a display configured to display an image;
a tape spring coupled to the display; and
a roller configured to wind or unwind the display and the tape spring, the roller including:
a motor;
a tape spring drum accommodating the motor and connected to the motor, the tape spring drum configured to wind or unwind the tape spring;
a tape spring casing accommodating the tape spring drum and the tape spring; and
a plurality of roll drums connected to opposite sides of the motor.

14. The display device of claim 13, wherein the roller further includes a spiral spring coupled to one of the plurality of roll drums and the tape spring drum, the spiral spring configured to accumulate elastic force in response to the display being wound about the roller.

15. The display device of claim 13, wherein the roller further includes a base plate coupled to a flat portion of the plurality of roll drums, the base plate having at least one planar surface, the display device further comprising:
a printed circuit board coupled to the display, the printed circuit board disposed on the at least one planar surface of the base plate.

16. The display device of claim 13, wherein the display has a length that corresponds to a circumference of the roller.

17. A display device comprising:
a roller configured to wind or unwind a display and a tape spring coupled to the display, the roller including:
a tape spring casing;
a tape spring drum configured to wind or unwind the tape spring, at least a portion of the tape spring drum being internal to the tape spring casing;
a motor connected to the tape spring drum, at least a portion of the motor being internal to the tape spring drum; and
a roll drum connected to the motor.

18. The display device of claim 17, wherein the roller further includes a guide element having at least one curved surface configured to guide a curved surface of the tape spring.

19. The display device of claim 17, wherein the roller further includes a spiral spring coupled to the roll drum and the tape spring drum, the spiral spring configured to accumulate elastic force as a result of a difference in diameter between the roll drum and the tape spring drum.

20. The display device of claim 17, wherein the roller has a flat portion, the display device further comprising:
a printed circuit board coupled to the display, the printed circuit board disposed on the flat portion of the roller.

* * * * *